United States Patent [19]

Engelhard

[11] Patent Number: 5,003,194
[45] Date of Patent: Mar. 26, 1991

[54] FORMATTER CIRCUIT FOR GENERATING SHORT AND VARIABLE PULSE WIDTH

[75] Inventor: Holger Engelhard, Nufringen, Fed. Rep. of Germany

[73] Assignee: Hewlett-Packard Co., Palo Alto, Calif.

[21] Appl. No.: 579,203

[22] Filed: Sep. 4, 1990

Related U.S. Application Data

[63] Continuation of Ser. No. 303,368, Jan. 27, 1989, abandoned.

[30] Foreign Application Priority Data

Jan. 28, 1988 [EP] European Pat. Off. ........ 88101210.8

[51] Int. Cl.⁵ .................. H03K 5/04; H03K 3/284
[52] U.S. Cl. .................. 307/265; 307/272.1; 328/58
[58] Field of Search ............ 307/265, 273, 243, 272.1; 328/58, 207

[56] References Cited

U.S. PATENT DOCUMENTS

| | | | |
|---|---|---|---|
| 4,051,387 | 9/1977 | Black | 307/265 |
| 4,314,164 | 2/1982 | Tin | 307/243 |
| 4,607,173 | 8/1986 | Knoedl | 307/291 |
| 4,837,763 | 6/1989 | Sasaki | 307/243 |

OTHER PUBLICATIONS

Lenk, "Handbook of Digital Electronics", 1981, by Prentice Hall, Inc., pp. 50 and 58.

Steele, K. A., Application of Digital Integrated Circuits to Linear Phase Detection, Electronic Engineering, May 1968, pp. 240-241.

*Primary Examiner*—Stanley D. Miller
*Assistant Examiner*—Trong Phan
*Attorney, Agent, or Firm*—Guy J. Kelley

[57] ABSTRACT

A formatter circuit for generating pulses of a variable, in particular extremely short width comprises an input terminal (10) receiving a pulse start signal which is fed to a frequency divider circuit (11) and another input terminal (12) receiving a pulse-stop signal which is fed to a second frequency divider circuit (13). One of these frequency divider circuits generates two internal signals which are fed to a multiplexing circuitry (16, 17, 18), whereas the other frequency divider circuit generates at least one signal which is the control signal for said multiplexing circuitry. (FIG. 3).

24 Claims, 6 Drawing Sheets

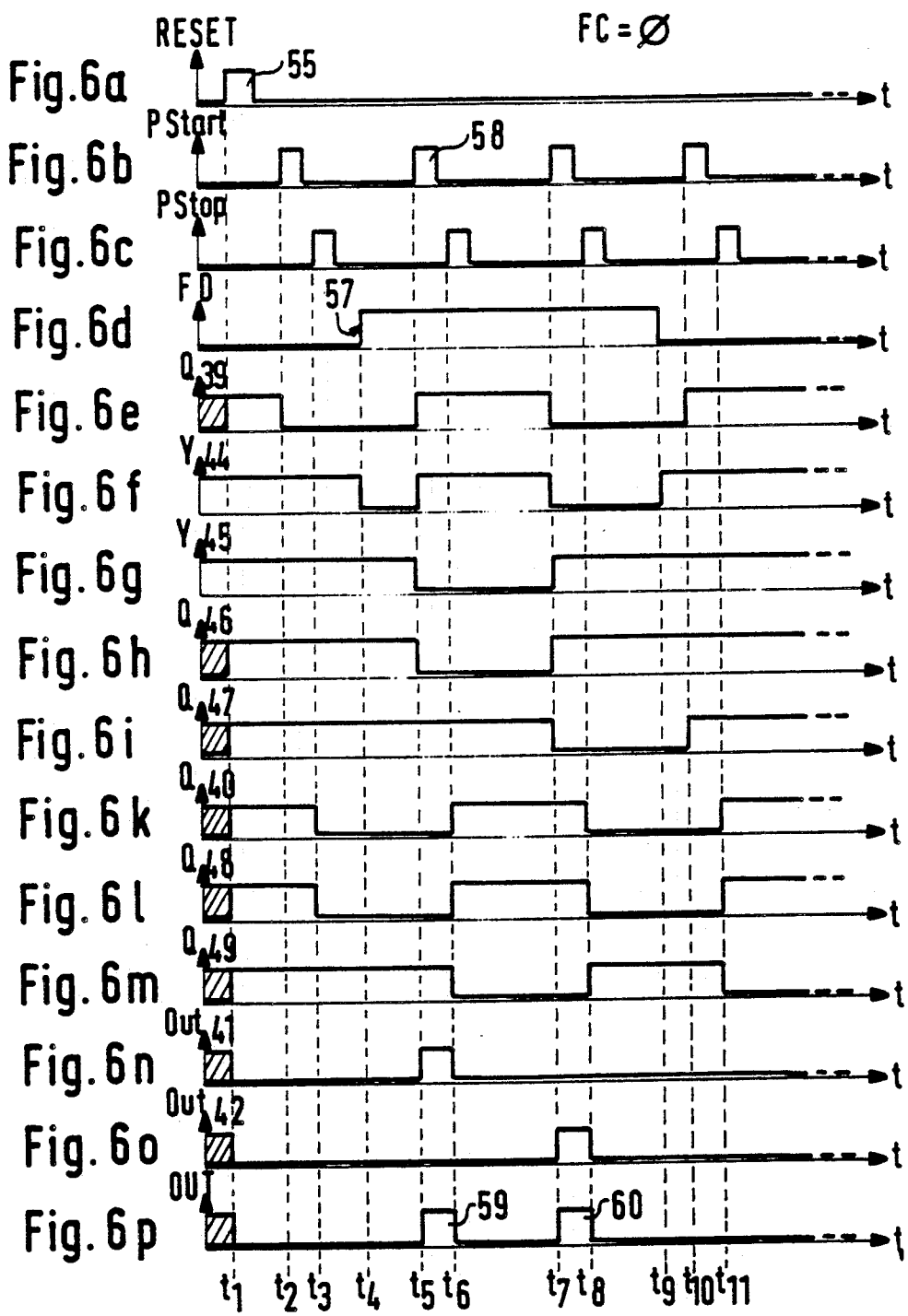

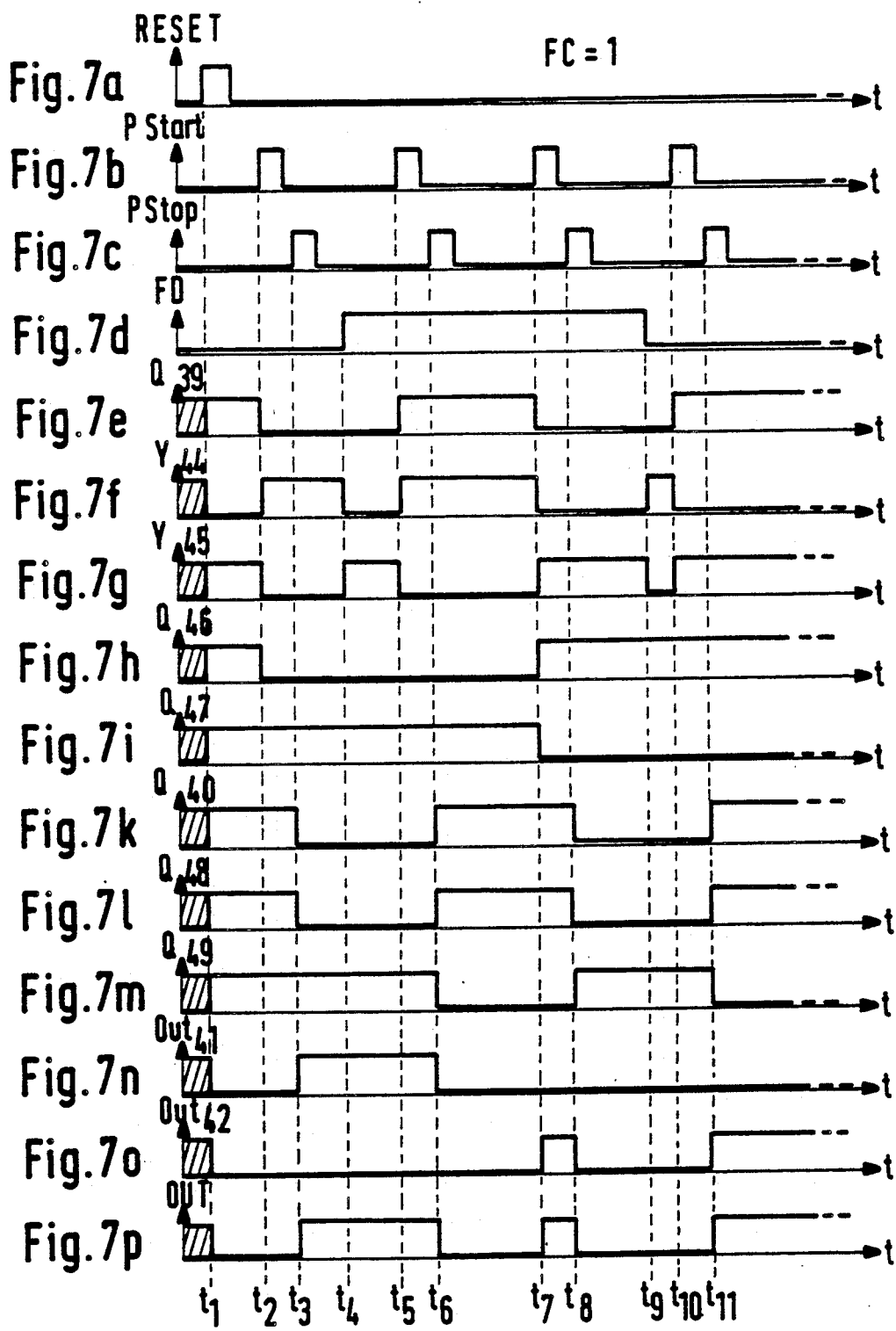

FORMATTER CIRCUIT FOR GENERATING SHORT AND VARIABLE PULSE WIDTH

CROSS REFERENCE TO RELATED APPLICATION

This application is a continuation of application Ser. No. 07/303,368, filed Jan. 27, 1989, now abandoned.

1. FIELD OF THE INVENTION

This invention relates to a formatter circuit for generating pulses of variable width, in particular of extremely short width, with at least one input terminal destined to receive a pulse start signal and least another input terminal destined to receive a pulse stop signal.

2. DESCRIPTION OF THE BACKGROUND

It is a major problem in pulse generator and integrated circuit tester technology to generate pulses of short or extremely short width, short rise and fall times and at high repetition rates.

A known technique to generate such short pulses of variable width uses a pulse start signal and a pulse stop signal, the latter being delayed in known manner with reference to the pulse stop signal. The pulse start signal is fed to the "set" terminal of a flip-flop and the pulse stop signal to the "reset" terminal of said flip-flop. Therefore, the width of the output pulse is defined by the delay between the pulse start and the pulse stop signal.

In this circuit, the minimum output pulse width is determined by the minimum pulse width of the input pulses, and, if the input pulses would overlap, the flip-flop would enter into a logically undefined state. Therefore, the input pulses must be as short as possible.

Other aspects which limit the minimum output pulse width are the recovery time and the set-up time of the flip-flop. As it is not possible to specify the pulse width of the input pulses beyond a certain range, the output pulse width contains also an element of uncertainty.

The shortest output pulse width attainable with the known formatter circuit is in the range of 3 nanoseconds (ns) using 100k ECL logic, and, with respect to the uncertainty discussed above, in the range of 5 ns. This is true for both positive and negative pulses.

SUMMARY OF THE INVENTION

It is a major objective of the present invention to provide a formatter circuit which can be used to generate pulses of shorter and predictable width.

According to one aspect of the invention, a formatter circuit according to the invention with at least one input terminal destined to receive a pulse start signal and at least another input terminal destined to receive a pulse stop signal is characterized by a combination of the following features:

(a) The pulse start signal as well as the pulse stop signal are each fed to separate frequency divider circuits, (b) the output of the first of said frequency divider circuits is wired to generate at least two internal signals, whereas (c) the output of the second of said frequency divider circuits is wired to generate at least one control signal, and (d) the internal signals generated by the first of said outputs are fed to the input terminals of a multiplexing circuitry, the control signals generated by the second of said outputs performing signal selection of said multiplexing circuitry.

The frequency divider circuits to which the pulse start and the pulse stop signal are fed can be regarded, in some respect, as "pulse shapers". For example, upon every positive transition of the pulse start signal, the associated frequency divider circuit toggles, i.e. changes its output state. The frequency dividers therefore generate output signals with a duty cycle of 50% and a frequency which is half the frequency of the incoming signals.

The output signals of said frequency divider circuits are absolutely independent of the pulse width of the incoming signals, i.e. the pulse start signal and the pulse stop signal. This is a major advantage of the present invention as there is no need to generate start and stop signals of accurate and short width. On the contrary, the width of the incoming pulse signals has absolutely no influence on the width of the generated output signal.

The output of the first of said frequency divider circuits, this may be the frequency divider circuit receiving the pulse start signal, or, alternatively, the circuit receiving the pulse stop signal, is wired to generate at least two internal (intermediate) signals. In active mode, these two internal signals are usually complementary to each other. The internal signals are then fed to the input terminals of a multiplexing circuitry. A control signal generated by the other frequency divider circuit selects one of the input terminals of said multiplexing circuitry.

The multiplexer therefore selects the first internal signal or the second internal signal dependent on the state of the control signal generated by the second frequency divider circuit. As the control signal is delayed with respect to the internal signals (or vice versa), it selects the first internal signal in a time interval in which a transition of said signal occurs. At the end of that time interval, it selects the second internal signal. The time period between the occurrence of the transition of the first internal signal and the selection of the second internal signal is equal to the delay time between the pulse start and the pulse stop signal.

Therefore, an output pulse is generated whose width corresponds to the delay time between the pulse start and the pulse stop signal.

If the two internal signals are complementary to each other, the second internal signal shows a transition in the next time interval.

Upon the end of said interval, the first internal signal is selected again, and therefore a second pulse is generated.

It is evident that the multiplexing circuitry serves to combine the internal signals and the control signal to an output pulse sequence of twice the frequency of the internal signals or the control signal, respectively. Therefore, the generated pulses have the same frequency as the incoming pulse start and pulse stop signals although the for matter circuit performs a 2:1 frequency division to "shape" the incoming signals. The formatter circuit according to the present invention may generate output pulse trains with a repetition rate of 100 MHz and more. The output pulse width is only dependent on the delay between the incoming (pulse start and pulse stop) signals, and therefore small pulses with a width of 1.5 ns and less may be generated. This applies for both positive and "negative" pulses (in the latter case, the pulse stop signal occurs only 1.5 ns before the occurrence of the pulse start signal). The output pulse width can simply be varied by variation of the delay time between the incoming signals.

Now let us assume that the second internal signal is not complementary to the first one, but always zero. In this case, the output frequency is only half the frequency of the incoming signals, but all other advantages of the new formatter circuit such as short and variable pulse width are maintained.

In a preferred embodiment of the invention, said multiplexing circuitry is implemented by logic gates which perform the following Boolean equation:

$$\overline{Q1}\overline{Q3} + \overline{Q2}Q3$$

or an equivalent reformulation of this equation.

Such logic gates implement a fast and easy multiplexing function. Advantageously, the following equation is used:

$$\overline{Q1 + \overline{Q3}} + \overline{Q2 + Q3}$$

The first internal signal (Q1) is therefore fed to a
The first internal signal (Q1) is therefore fed to a NOR gate, the second input of that gate being controlled by the inversion of control signal Q3. The second internal signal Q2 is fed to a second NOR gate whose second input is controlled by control signal Q3. The outputs of said NOR gates are fed to an OR gate.

It is further advantageous if the second frequency divider circuit is wired to generate two control signals, the second of these control signals being the negation of the first control signal. In this case, the first control signal need not be inverted (inversion needs additional propagation delay time and therefore could cause inaccuracies in the generated signal).

Frequency division in the required 2:1 relation may be easily performed by the use of flip-flops, preferably flip-flops of the D type with the $\overline{Q}$ output fed back to the D input. The positive and negative output may be fed to separate additional flip-flops each. These four additional flip-flops—which are clocked by the pulse start and pulse stop signal—are used to balance the output of the frequency divider flip-flops as different loads at the outputs of the latter flip-flops could cause jitter.

In another embodiment of the invention, the output of the first frequency divider circuit is wired with at least on data input.

The data input may be used to switch the outgoing signal on and off, i.e. to inhibit the generated pulse sequence.

A formatter circuit embodying the invention will now be particularly described with reference to the accompanying drawings, in which:

FIG. 1 shows a prior art formatter,

FIG. 2a-c shows a timing diagram of the circuit of FIG. 1,

FIG. 6 is a timing diagram of the circuit of FIG. 5 in a first mode of operation, the so-called "return to zero" mode.

FIG. 7 is a timing diagram of the circuit of FIG. 5 in a second mode of operation, the so-called "return to complement" mode.

DETAILED DESCRIPTION

Figure 1:
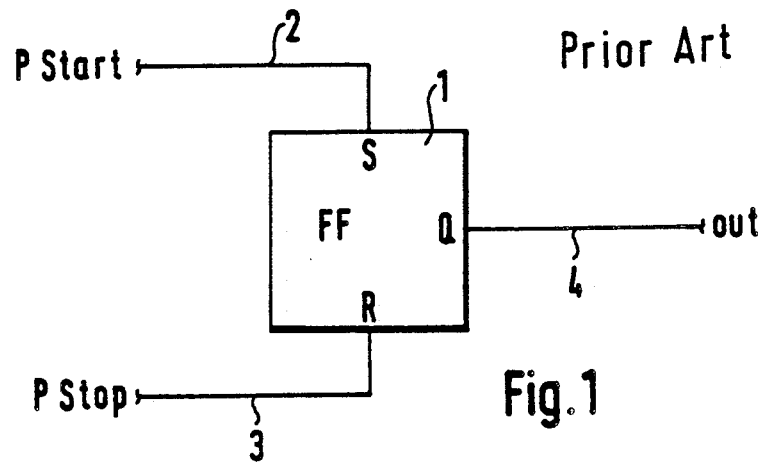

In FIG. 1, which shows a known formatter circuit, a flip-flop 1 is used for pulse shaping. A pulse start signal Pstart is fed via input line 2 to the set terminal S of that flip-flop, whereas a pulse stop signal Pstop is fed via input line 3 to the reset terminal R of said flip-flop. The output signal "OUT" is generated on output line 4 by the Q output of the flip-flop.

Figures 2A, 2B, 2C:
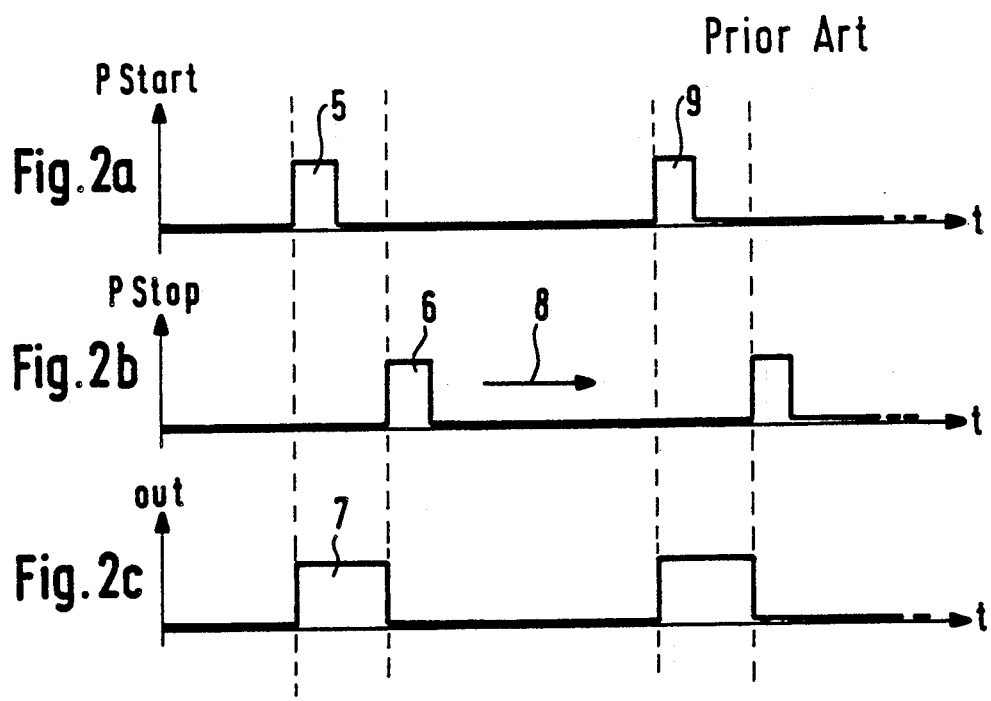

FIG. 2a depicts the timing diagram of pulse start signal Pstart, whereas FIG. 2b depicts pulse stop signal Pstop and FIG. 2c the output signal "OUT". Both the Pstart and the Pstop signals are pulse sequences. The first pulse 5 of the Pstart sequence sets flip-flop 1, whereas it is reset by pulse 6 of the Pstop sequence. This results in the generation of an output pulse 7 on output line 4. It is evident that the pulse width of input pulses 5 and 6 directly influences the minimum output pulse width as pulses 5 and 6 cannot overlap (in this case both the "set" as well as the "reset" input of flip-flop 1 would be equal to one, which would result in a logically undefined state of that flip-flop).

If the Pstop sequence is shifted to the right as indicated by arrow 8, the output pulse width may be varied. If the sequence is shifted so far that it approaches the next Pstart pulse 9, the formatter circuit generates "negative" pulses; the width of these negative pulses is also limited by the width of the Pstart and Pstop pulses as these incoming pulses should not overlap.

Other factors which limit the minimum output pulse width are the set-up and recovery times of flip-flop 1.

Figure 3:
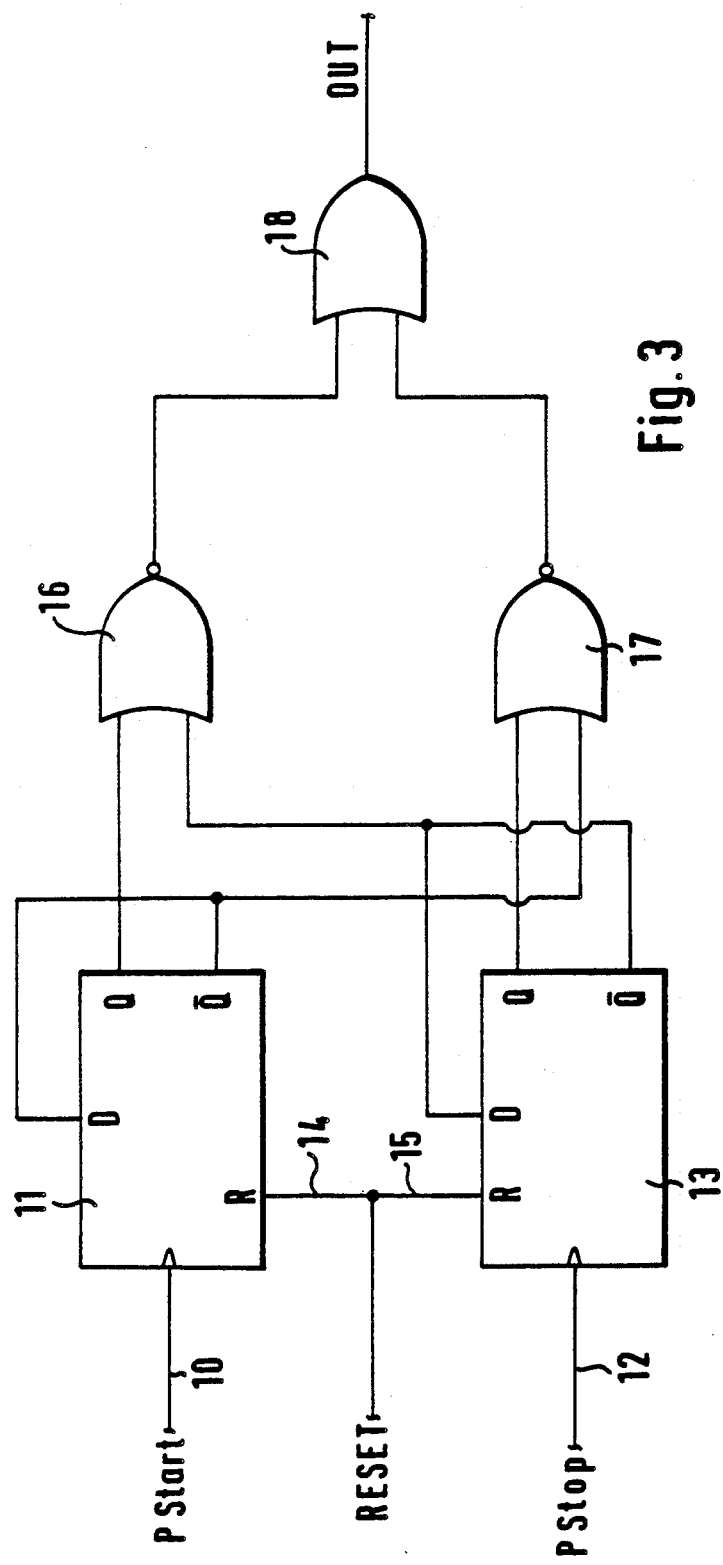
FIG. 3 is a first simplified example of a formatter circuit according to the present invention.

FIG. 3 depicts a first example of a formatter circuit according to the invention. The pulse start signal Pstart is fed by an input line 10 to a first flip-flop 11 of the D type. Output $\overline{Q}$ is fed back to the D input of that flip-flop, whereas line 10 is connected with its clock input.

In similar manner, the pulse stop signal Pstop is fed via input line 12 to the clock input of a second D flip-flop 13. The $\overline{Q}$ output of that flip-flop is also fed back to its D input; therefore, both flip-flops operate as 2:1 frequency dividers.

A RESET pulse is fed via lines 14 and 15 to the reset terminals of flip-flops 11 and 13.

Output $\overline{Q}$ of flip-flop 11 and output Q of flip-flop 13 are connected with the inputs of NOR gate 16. In similar manner, the $\overline{Q}$ output of flip-flop 11 and the Q output of flip-flop 13 are connected with a second NOR gate 17. The outputs of said NOR gates are connected with the input terminals of an OR gate 18 which generates an output pulse OUT.

Figure 4:
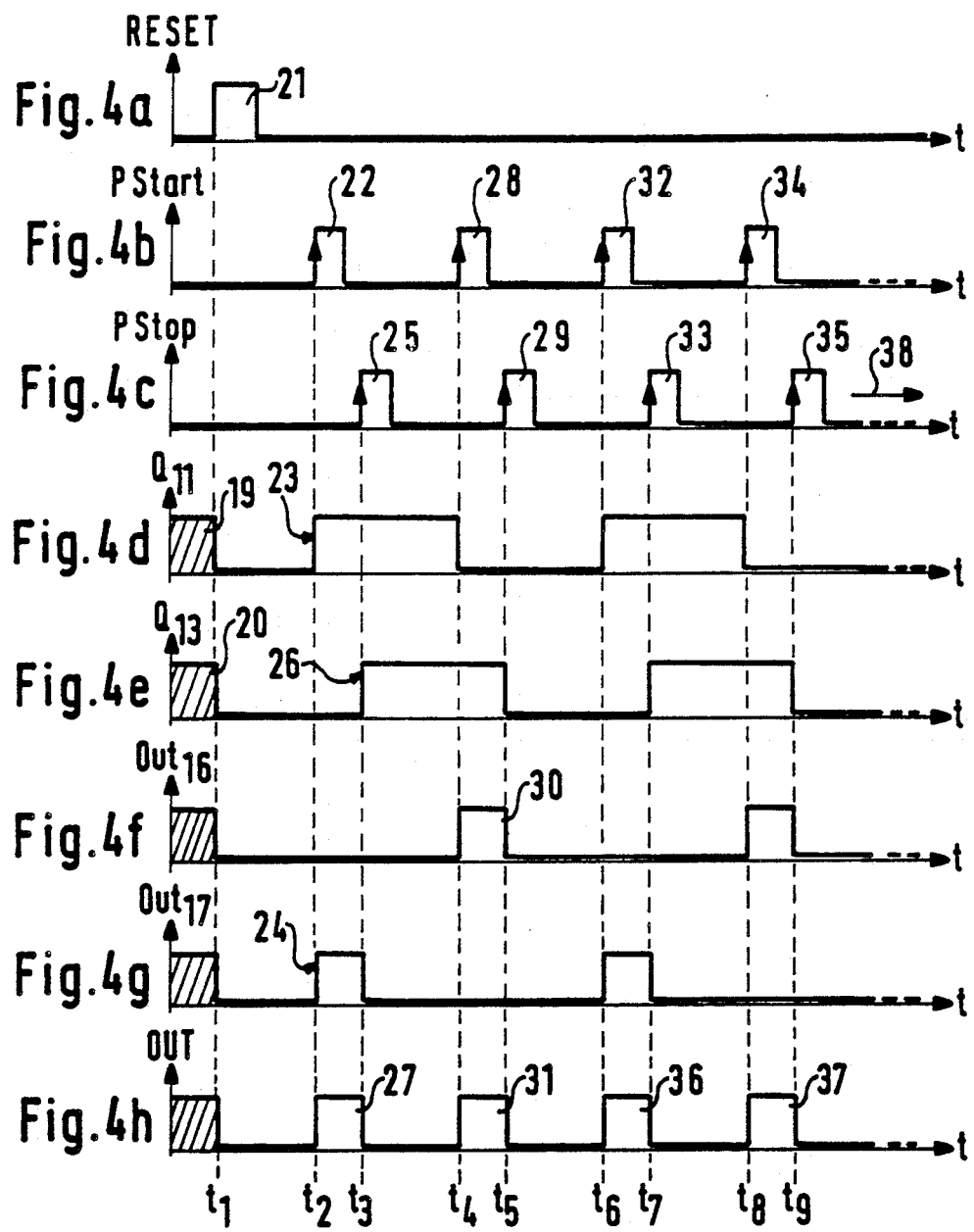
FIG. 4a-h depicts the timing diagram of the circuit of FIG. 3.

FIG. 4 depicts a timing diagram of the circuit of FIG. 3. FIG. 4a is the diagram of the RESET pulse, FIG. 4b is the Pstart sequence, FIG. 4c the Pstop sequence, FIG. 4d the Q output of flip-flop 11, FIG. 4e the Q output of flip-flop 13, FIG. 4f the output of NOR gate 16, FIG. 4g the output of NOR gate 17 and FIG. 4h the output signal OUT of OR gate 18.

Prior to the occurrence of the reset pulse (t<t1), the outputs of flip-flops 11 and 13 may be in either state as indicated by boxes 19 and 20. Upon the occurrence of RESET pulse 21 (t=t1), both flip-flops are reset and therefore, the Q output of these flip-flops is zero (cf. FIGS. 4d and e).

Upon the occurrence of the first Pstart pulse (reference No. 22), flip-flop 11 toggles as indicated by 23. The $\overline{Q}$ output of flip-flop 11 is therefore "0", and NOR gate 17 has a "1" at its output as indicated by 24.

Upon the occurrence of the first Pstop pulse 25, the Q output of flip-flop 13 also changes its state as indicated by 26. Therefore, an output pulse 27 of width t3–t2 is generated.

It is reasonable that the width of the output pulse is only determined by the delay between the incoming pulses 22 and 25. These pulses may also overlap which is not possible in the prior art circuit as shown in FIG. 1. The output pulse width may be in the range of 1.5 ns or less using 100k ECL logic.

The next pair of incoming pulses (Pstart pulse 28 at t4 and Pstop pulse 29 at t5) are used to generate in a similar manner a pulse 30 which occurs at the output of NOR gate 16. This pulse is also transmitted to the output of OR gate 18 as indicated by 31. Pulse 31 has the same width as pulse 27.

In the same manner, the next incoming pulses 32 and 33 / 34 and 35 are used to generate output pulses 36 (t6–t7) and 37 (t8–t9).

The formatter circuit therefore generates a first sequence of pulses occurring at the output of NOR gate 16 (s. FIG. 4f) and a second sequence occurring at the output of NOR gate 17 (cf. FIG. 4g). These two sequences have a delay of half a period with respect to each other. They are combined to the output sequence as shown in FIG. 4h.

The output pulse sequence has therefore twice the frequency of the sequences shown in FIG. 4f and 4g, typically in the range of 100 MHz and more. Therefore, the output pulse sequence has the same frequency as the incoming pulses Pstart and Pstop although flip-flops 11 and 13 operate as 2:1 frequency dividers.

It is also possible to use the formatter circuit of FIG. 3 to generate negative pulses. If the delay of the Pstop sequence is increased with reference to the Pstart sequence (cf. arrow 38 in FIG. 4c), the generated output pulses become broader until only small negative pulses remain. The input pulses may also overlap in the case of negative output pulses; therefore, the generated negative output pulses may be as small as the positive pulses.

By varying the delay between the Pstart and Pstop sequence, the width of the output pulses may be easily varied.

In the circuit of FIG. 3, the Q and $\overline{Q}$ outputs of flip-flop 11 can be regarded as internal signals fed to a multiplexing circuitry which consists of gates 16, 17 and 18. The outputs of flip-flop 13 are control signals which control said multiplexing circuitry. Obviously, the rolls of flip-flops 11 and 13 may also be reversed.

The multiplexing circuitry represented by gates 16 to 18 generates an output signal OUT according to the following Boolean equation:

$$\overline{Q1+Q3} + \overline{Q2+Q3}$$

which is equivalent to the equation:

$$\overline{Q1}\overline{Q3} + \overline{Q2}\overline{Q3}$$

wherein Q1 is the Q output of flip-flop 11, Q2 is the $\overline{Q}$ output of flip-flop 11 and Q3 is the Q output of flip-flop 13. Of course, the above equations may be rewritten with $\overline{Q2}=Q1$ as both are complementary outputs of flip-flop 11. However, this condition is not mandatory as will be shown by way of the example in FIG. 5.

It is understood that the multiplexing function may also be realized by way of another Boolean equation like $$Q1Q3 + Q2\overline{Q3}$$

or the like.

Figure 5:
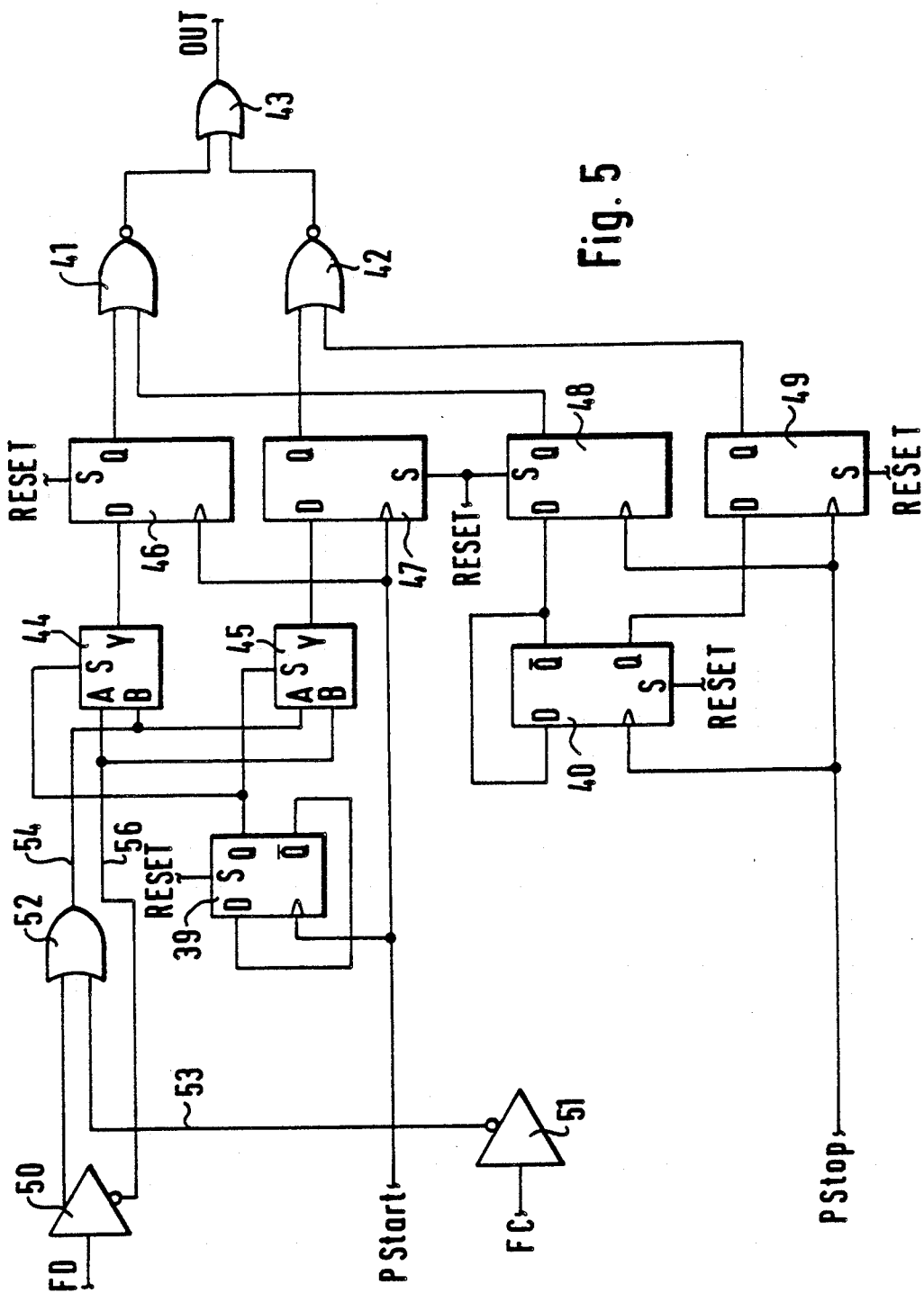
FIG. 5 depicts a complete formatter circuit according to the invention including some additional features.

FIG. 5 depicts an example of a more sophisticated formatter circuit according to the present invention. In this circuit, flip-flops 39 and 40 correspond to flip-flops 11 and 13 of FIG. 3, i.e. operate as 2:1 frequency dividers. The same applies to gates 41 to 43 which correspond to gates 16 to 18 of the circuit of FIG. 3.

In the circuit of FIG. 5, an additional input FD (formatter data) is used to switch pulse generation on and off, i.e. the circuit operates only if FD=1. An additional FC (formatter control) input is used to select various modes. In the circuit shown in FIG. 5, a "return-to-zero" mode (FC=0) and a "return-to-complement" mode (FC=1) may be selected as will be explained below. Multiplexers 44 and 45 combine the FD signal and the FC signal with the output of flip-flop 39. Flip-flops 46 to 49 are used for symmetrizing purposes as in most of the usual flip-flops the $\overline{Q}$ output is delayed with reference to the Q output (the reason is that the $\overline{Q}$ output has to be inverted). Furthermore, different loads influence the rise times of signals and thereby cause jitter. For example, the $\overline{Q}$ output of gate 40 has to drive the D inputs of both flip-flops 40 and 48, whereas the Q output of flip-flop 40 has only to drive the D input of flip-flop 49.

The circuit of FIG. 5 also contains an amplifier 50 with a non-inverting and an inverting output, an amplifier 51 with an inverting output and an OR gate 52. For graphic purposes, the RESET line is not explicitly shown in FIG. 5. It is understood that all reset terminals are connected with a common RESET input.

FIG. 6 depicts a timing diagram of the circuit of FIG. 5 in so-called "return-to-zero" (RTZ) mode. In this mode, output pulses are only generated if FD=1, and the output signal OUT remains at zero if FD=0.

In detail, FIG. 6a depicts the timing diagram of the RESET lse, FIG. 6b the Pstart sequence, FIG. 6c the Pstop sequence, FIG. 6d the FD signal, FIG. 6e the Q output of flip-flop 39, FIG. 6f the output of multiplexer 44, FIG. 6g the output of multiplexer 45, FIG. 6h the Q output of flip-flop 46, FIG. 6i the Q output of flip-flop 47, FIG. 6k the Q output of flip-flop 40, FIG. 6l the Q output of flip-flop 48, FIG. 6m the Q output of flip-flop 49, FIG. 6n the output of NOR gate 41, FIG. 6o the output of NOR gate 42 and FIG. 6p the OUT output.

As FC=0, the signal on line 53 is always 1. Therefore, the signal on line 54—which is connected with the B input of multiplexer 44 and the A input of multiplexer 45—is also always 1.

Prior to the occurrence of RESET pulse 55, flip-flops 39, 40 and 46 to 49 are in an undefined state. Upon RESET=1 (t=t1), all flip-flops are set.

Flip-flop 39 toggles with the positive transition of every Pstart pulse as indicated by FIG. 6e. In similar manner, flip-flop 40 toggles with the positive transition of every Pstop signal. The outputs of flip-flops 48 and 49 also toggle with every Pstop pulse as indicated by FIGS. 6l and 6m.

As just mentioned, the signal on line 54 is always "1". As long as FD=0, the signal on line 56 is also always "1". Therefore, multiplexers 44 and 45 always transmit a "1" regardless which inputs are selected.

If FD changes state to "1" at t=t4 (reference No. 57), a "0" is fed to the A terminal of multiplexer 44 and to the B terminal of multiplexer 45. Therefore, these multiplexers select "0"s and "1"s alternating dependent on the Q output of flip-flop 39. As long as FD =1, the Y outputs are complementary to each other (cf. FIGS. 6f and 6g), and the circuit operates in a similar manner as the circuit of FIG. 3. When FD=1, the Q outputs of flip-flops 46 and 47 are complementary to each other after the first occurrence of a Pstart pulse (cf. Pstart pulse 58 at t=t5). In similar manner, the Q outputs of flip-flops 48 and 49 are complementary to each other, but independent of the FD signal.

As long as FD=1, the circuit generates a sequence of output pulses (as indicated by reference numbers 59 and 60) with the same frequency as the incoming pulse sequences Pstart and Pstop. When FD returns to zero (t=t9), the output signal remains also zero.

FIG. 7 shows a timing diagram of another operating mode, the so-called "return-to-complement" (RTC) mode. In this mode, FC is always 1. Therefore, the signal on the line 53 is always zero, and line 54 provides the FD signal. Multiplexers 44 and 45 select alternatingly FD or its complement from the inverting output of amplifier 50 on line 56. The composed output signal "OUT" contains a pulse sequence as long as FD=1 (e.g., from t=t5 to t=t6 and from t=t7 to t=t8) and returns to the complement of the FD signal upon the occurrence of every Pstop pulse.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. Formatter circuit for generating pulses of variable width at least one input terminal (10) destined to receive a pulse start signal and at least another input terminal (12) destined to receive a pulse stop signal, the formatter circuit comprising:
said pulse start signal being fed to a first frequency divider circuit (39) and said pulse stop signal being fed to a second frequency divider circuit (40); the output of the first (39) of said frequency divider circuits wired to generate at least two internal signals (Y44, the output of MPX 44 and Y45, the output of MPX45); the output of the second (40) of said frequency divider circuits is wired to generate at least two control signals (Q40 and $\overline{Q40}$); the internal signals generated by the first of said frequency divider circuits fed via a first separate flip-slops (46,47) to the input terminals of a multiplexing circuitry (41-43); and the control signals generated by the second of said frequency divider circuits being fed via second separate slip-slops (48,49) and performing signal selection of said multiplexing circuitry (41-43).

2. Formatter circuit according to claim 1, further comprising: the output of said second frequency divider circuit (40) wired to generate two control signals(Q3 and $\overline{Q3}$), the second ($\overline{Q3}$) of these control signals being the negation of the first (Q3) control signal.

3. Formatter circuit according to claim 1, further comprising: internal signals Y44 and Y45, to combine with said control signal Q40 in said multiplexing circuitry (41-43) by means of logic gates implementing the following Boolean equation:

$$\overline{Q39} + Q40 + Q39\overline{Q40}$$

4. Formatter circuit according to claim 3, further comprising: the output of said second frequency divider circuit (40) wired to generate two control signals (Q3 and $\overline{Q3}$), the second ($\overline{Q3}$) of these control signals being the negation of the first (Q3) control signals.

5. Formatter circuit according to claim 2, further comprising: each of said internal signals fed into the first input of separate NOR gates (41,42), the second inputs of said NOR gates (41,42) being controlled by said control signals, respectively, and the outputs of said NOR gates (41,42) fed into an OR gate (43).

6. Formatter circuit according to claim 5, further comprising: the output of said second frequency divider circuit (40) wired to generate two control signals (Q3 and $\overline{Q3}$), the second ($\overline{Q3}$) of these control signals being the negation of the first (Q3) control signal.

7. Formatter circuit according to claim 1, wherein said frequency divider circuits further comprising at least one flip-flop in each of said frequency divider circuits.

8. Formatter circuit according to claim 7, further comprising a positive as well as a negative output of each of said frequency divider circuits and each of said outputs being fed to a separate flip-flop (46-49).

9. Formatter circuit according to claim 8, further comprising a formatter data input (FD), said formatter data input being connected with the second data input (B) of a first multiplexer (44) and the first data input (A) of a second multiplexer (45), the negation of said formatter data input being connected with the first data input (A) of said first multiplexer (44) and the second data input (B) of said second multiplexer (45), wherein the Q output of said first frequency divider circuit (39) is connected with the select inputs of said first and second multiplexers (44,45).

10. Formatter circuit according to claim 2, wherein said frequency divider circuits (39,40) further comprising at least one flip-flop in each of said frequency divider circuits.

11. Formatter circuit according to claim 10 wherein said flip-flops are a D type having a Q and a $\overline{Q}$ outputs, and a D input, with the $\overline{Q}$ output fed back to the D input.

12. Formatter circuit according to claim 11, further comprising the positive as well as the negative outputs of said frequency divider circuits are each fed to a separate flip-flop (46-49).

13. Formatter circuit according to claim 12 wherein the separate flip-flop is a D type.

14. Formatter circuit according to claim 3, wherein said frequency divider circuits (39,40) further comprising at least one flip-flop in each of said frequency divider circuits.

15. Formatter circuit according to claim 14 wherein said flip-flops are a D type having a Q and a $\overline{Q}$ outputs, and a D input, with the $\overline{Q}$ output fed back to the D input.

16. Formatter circuit according to claim 15, further comprising the positive as well as the negative outputs of said frequency divider circuits are each fed to a separate flip-flop (46-49).

17. Formatter circuit according to claim 16 wherein the separate flip-flop is a D type.

18. Formatter circuit according to claim 5, wherein said frequency divider circuits (39,40) further comprising at least one flip-flop in each of said frequency divider circuits.

19. Formatter circuit according to claim 18 wherein said flip-flops are a D type having a Q and a $\overline{Q}$ outputs, and a D input, with the $\overline{Q}$ output fed back to the D input.

20. Formatter circuit according to claim 19, further comprising the positive as well as the negative outputs of said frequency divider circuits are each fed to a separate flip-flop (46-49).

21. Formatter circuit according to claim 20 wherein the separate flip-flop is a D type.

22. Formatter circuit according to claim 1, further comprising a formatter data input (FD), said formatter data input being connected with the second data input (B) of a first multiplexer (44) and the first data input (A) of a second multiplexer (45), the negation of said formatter data input being connected with the first data input (A) of said first multiplexer (44) and the second data input (B) of said second multiplexer (45), wherein the Q output of said first frequency divider circuit (39) is connected with the select inputs of said first and second multiplexers (44,45).

23. Formatter circuit according to claim 3, further comprising a formatter data input (FD), said formatter data input being connected with the second data input (B) of a first multiplexer (44) and the first data input (A) of a second multiplexer (45), the negation of said formatter data input being connected with the first data input (A) of said first multiplexer (44) and the second data input (B) of said second multiplexer (45), wherein the Q output of said first frequency divider circuit (39) is connected with the select inputs of said first and second multiplexers (44,45).

24. Formatter circuit according to claim 5, further comprising a formatter data input (FD), said formatter data input being connected with the second data input (B) of a first multiplexer (44) and the first data input (A) of a second multiplexer (45), the negation of said formatter data input being connected with the first data input (A) of said first multiplexer (44) and the second data input (B) of said second multiplexer (45), wherein the Q output of said first frequency divider circuit (39) is connected with the select inputs of said first and second multiplexers (44,45).

* * * * *